US012748141B2

(12) United States Patent
Liu et al.

(10) Patent No.: US 12,748,141 B2
(45) Date of Patent: Sep. 29, 2026

(54) METHOD AND RELATED DEVICE FOR LOCATING RING POWER NETWORK FAULT

(71) Applicant: Electric Power Research Institute of Yunnan Power Grid Co., Ltd, Yunnan (CN)

(72) Inventors: Hongwen Liu, Yunnan (CN); Xianping Zhao, Yunnan (CN); Jindong Yang, Yunnan (CN); Chenchao Chai, Yunnan (CN); Lijun Tang, Yunnan (CN); Ding Nie, Yunnan (CN); Quancong Zhu, Yunnan (CN); Yongjie Nie, Yunnan (CN); Dexu Zou, Yunnan (CN); Shaolei Zhai, Yunnan (CN); Zhilei Zhang, Yunnan (CN)

(73) Assignee: Electric Power Research Institute of Yunnan Power Grid Co., Ltd., Yunnan (CN)

( * ) Notice: Subject to any disclaimer, the term of this patent is extended or adjusted under 35 U.S.C. 154(b) by 651 days.

(21) Appl. No.: 18/184,674

(22) Filed: Mar. 16, 2023

(65) Prior Publication Data

US 2023/0280388 A1 Sep. 7, 2023

Related U.S. Application Data

(63) Continuation of application No. PCT/CN2022/124235, filed on Oct. 10, 2022.

(30) Foreign Application Priority Data

Mar. 2, 2022 (CN) ......................... 202210205007.1

(51) Int. Cl.
*G01R 31/08* (2020.01)

(52) U.S. Cl.
CPC .................................. *G01R 31/086* (2013.01)

(58) Field of Classification Search
CPC .. G01R 31/086; G01R 31/088; G01R 31/085; Y04S 10/52
See application file for complete search history.

(56) References Cited

U.S. PATENT DOCUMENTS 11,467,200 B2 * 10/2022 Dzienis ................ G01R 31/086
2018/0210060 A1 * 7/2018 Guzman-Casillas .. G01R 35/00

FOREIGN PATENT DOCUMENTS

CN 106771868 5/2017
CN 106771884 A * 5/2017 ............. G01R 19/25
(Continued)

OTHER PUBLICATIONS

Bayati, et al., "Local Fault Location in Meshed DC Microgrids Based On Parameter Estimation Technique", IEEE Systems Journal, vol. 16, No. 1, Mar. 2022 (Year: 2022).*
(Continued)

*Primary Examiner* — Catherine T. Rastovski
*Assistant Examiner* — Toni D Sauncy
(74) *Attorney, Agent, or Firm* — Bay State IP, LLC

(57) ABSTRACT

The embodiments of the present invention disclose a method and a related device for locating a ring power network fault. The method comprises: expanding in each ring line segment with an arbitrary point as a coordinate origin in a ring power network to construct a plurality of reference coordinate systems; acquiring monitoring point coordinate information and wavehead arrival time information of each of the monitoring point positions; acquiring assumed fault point information; acquiring a traveling wave propagation speed; constructing a plurality of distributed fault location equation sets according to the monitoring point coordinate information, the wavehead arrival time information, the assumed
(Continued)

fault point information and the traveling wave propagation speed in each of the reference coordinate systems; and determining an actual fault position according to a solution result of each of the distributed fault location equation sets and the assumed fault section.

11 Claims, 5 Drawing Sheets

(56) References Cited

FOREIGN PATENT DOCUMENTS

| | | | | | |
|---|---|---|---|---|---|
| CN | 109950884 | | | 6/2019 | |
| CN | 111856213 | | | 10/2020 | |
| CN | 112363021 | A | * | 2/2021 | ........... G01R 31/088 |
| CN | 112946424 | A | * | 6/2021 | ........... G01R 31/088 |
| CN | 113009278 | A | * | 6/2021 | ........... G01R 31/088 |
| CN | 113138320 | | | 7/2021 | |
| CN | 113406440 | | | 9/2021 | |
| CN | 110780153 | B | * | 12/2021 | ........... G01R 31/085 |
| CN | 114689990 | | | 7/2022 | |
| WO | 2019232595 | | | 12/2019 | |

OTHER PUBLICATIONS

GuzmÃ¡n, et al., "Accurate and economical traveling-wave fault locating without communications," 2018 71st Annual Conference for Protective Relay Engineers (CPRE), College Station, TX, USA, 2018 (Year: 2018).*
Muzzamel, et al., "MT-HVdc Systems Fault Classification and Location Methods Based on Traveling and Non-Traveling Waves: A Comprehensive Review", Appl. Sci. 2019, 9, 4760 (Year: 2019).*
Yu, et al., "A Novel Traveling Wave Fault Location Method for Transmission Network Based on Directed Tree Model and Linear Fitting", IEEE Access, vol. 8, 2020 (Year: 2020).*
Wang, et al., "Overdetermined Equation Based Fault Location Avoiding Influence of Traveling Wave Velocity," 2020 IEEE 3rd Student Conference on Electrical Machines and Systems (SCEMS), Jinan, China, 2020, pp. 486-490. (Year: 2020).*
Yang_CN112363021_English_Translation_Used for Examination (Year: 2021).*
Ding, et al., "Distributed Traveling-Wave-Based Fault-Location Algorithm Embedded in Multiterminal Transmission Lines" IEEE Transactions on Power Delivery, vol. 33, No. 6, pp. 3045-3054, Dec. 2018. (Year: 2018).*
Guzman, et al., "Accurate Single-End Fault Locating Using Traveling-Wave Reflection Information", 14th International Conference on Developments in Power System Protection Belfast, United Kingdom. Mar. 12-15, 2018. (Year: 2018).*
Korkali, et al., "Traveling-Wave-Based Fault-Location Technique for Transmission Grids via Wide-Area Synchronized Voltage Measurements" IEEE Transactions on Power Systems, vol. 27, No. 2, pp. 1003-1011, May 2012. (Year: 2012).*
Naidu, "A Traveling Wave-Based Fault Location Method Using Unsynchronized Current Measurements" IEEE Transactions on Power Delivery, vol. 34, No. 2, pp. 505-513, Apr. 2019. (Year: 2019).*
Hatch. The Lower Churchill Project DC1010-Voltage and Conductor Optimization Newfoundland and Labrador Hydro Lower Churchill Project; Exhibit CE-01 Rev. 1 (Public); Board of Commissioners of Public Utilities. 2008 (Year: 2008).*
Benato, et al., "Travelling Wave Fault Location Method for Unearthed-Operated High-Voltage Overhead Line Grids" IEEE Transactions on Power Delivery, vol. 33, No. 6, Dec. 2018 (Year: 2018).*
Liu, et al."A Traveling Wave Fault Location Method for Earth Faults Based on Mode Propagation Time Delays of Multi-measuring Points", Przegläd Elektrotechniczny (Electrical Review), ISSN 0033-2097, R. 88 NR 3a/2012 (Year: 2012).*
"International Search Report (Form PCT/ISA/210) of PCT/CN2022/124235," mailed on Dec. 23, 2022, pp. 1-5.
"Written Opinion of the International Searching Authority (Form PCT/ISA/237) of PCT/CN2022/124235", mailed on Dec. 27, 2022, pp. 1-6.

* cited by examiner

METHOD AND RELATED DEVICE FOR LOCATING RING POWER NETWORK FAULT

CROSS-REFERENCE TO RELATED APPLICATION

This application is a continuation of international PCT application serial no. PCT/CN2022/124235, filed on Oct. 10, 2022, which claims the priority benefit of China application no. 202210205007.1, filed on Mar. 2, 2022. The entirety of each of the above mentioned patent applications is hereby incorporated by reference herein and made a part of this specification.

TECHNICAL FIELD

The present invention relates to the field of ring power network technology, and more particularly to a method and a related device for locating a ring power network fault.

DESCRIPTION OF RELATED ART

AC/DC transmission and distribution lines are important components in an electrical power system. Line faults will affect the stability of the system and cause the interruption of the user's power supply. Manual search for fault points is time-consuming and labor-intensive. Rapid and accurate line fault location technology is conducive to the timely repair of fault lines, reduce the economic loss caused by power outage, and reduce the difficulty of manual line inspection. Power system fault location technology mainly includes an impedance method and a traveling wave method. The impedance method is easily affected by fault resistance, transformer error and power parameters. The practical application effect is not ideal. The traveling wave method has been widely used in power system because of its simple principle and high accuracy. However, the traveling wave method has an uncertain wave speed in the cable. The loss of traveling wave information will cause the failure of location. For the ring power network traveling wave propagation in the ring network, fault location needs to cooperate with the analysis of circuit breaker tripping situation. It is difficult to achieve regional location. Multiple sets of traveling wave location devices are needed. The traveling wave location will fail if any traveling wave location device signal loss occurs.

Current distributed fault location technology has a good prospect of engineering application. Fault location by sensors in the fault section and adjacent sensors can eliminate the impact of wave speed, but the fault section needs to be judged first. The fault location equation is complex. The head and end of the location equation and the fault location equation along the line are not unified. Traveling wave fault location calculation method is very easy to cause fault location failure for the ring power network, because of traveling wave from the fault point to both sides, the traveling wave detected by traveling wave monitoring sensors at both ends of a certain section of the line being the traveling wave at both sides of the fault point.

SUMMARY

A series of concepts in simplified forms are introduced in the summary section, which is described in further detail in the detailed description. This summary of the invention is not intended to limit the key features and essential features of the claimed subject matter, nor is it intended to determine the scope of the claimed subject matter.

In order to further improve the accuracy and reliability of traveling wave location in a ring power network, in a first aspect, the present invention provides a method for locating a ring power network fault, the method comprising the following steps.

Expanding in each ring line segment with an arbitrary point as a coordinate origin in a ring power network to construct a plurality of reference coordinate systems, wherein the each ring line segment is a line segment between two adjacent monitoring point positions.

Acquiring monitoring point coordinate information and wavehead arrival time information of each of the monitoring point positions in each of the plurality of reference coordinate systems.

Acquiring assumed fault point information, wherein the assumed fault point information comprises an assumed fault point coordinate, assumed occurrence fault time and an assumed fault section.

Acquiring a traveling wave propagation speed.

Constructing a plurality of distributed fault location equation sets according to the monitoring point coordinate information, the wavehead arrival time information, the assumed fault point information and the traveling wave propagation speed in each of the plurality of reference coordinate systems.

Determining an actual fault position according to a solution result of each of the plurality of distributed fault location equation sets and the assumed fault section.

Optionally, the assumed fault section comprises a first assumed fault section. Each of the reference coordinate system comprises a first reference coordinate system. The plurality of distributed fault location equation sets comprise a first distributed fault location equation set which is determined according to the first assumed fault section, the traveling wave propagation speed, and the monitoring point coordinate information and the wavehead arrival time information in the first reference coordinate system.

The steps of determining the actual fault position according to the solution result of each of the plurality of distributed fault location equation sets and the assumed fault section comprises the following steps.

Solving the first distributed fault location equation set to determine a first assumed fault position.

Taking the first assumed fault position as the actual fault position if the first assumed fault position is located in the first assumed fault section.

Optionally, the assumed fault section further comprises a second assumed fault section. The reference coordinate system further comprises a second reference coordinate system. The plurality of distributed fault location equation sets further comprise a second distributed fault location equation set and a third distributed fault location equation set. The second distributed fault location equation is determined according to the second assumed fault section, the traveling wave propagation speed, and the monitoring point coordinate information and the wavehead arrival time information in the first reference coordinate system. The third distributed fault location equation set is determined according to the first assumed fault section, the traveling wave propagation speed, and the monitoring point coordinate information and the wavehead arrival time information in the second reference coordinate system.

The above method further comprises the following steps.

Solving a second distributed fault location equation set to determine a second assumed fault position if the first assumed fault position is outside the first assumed fault section, and taking the second assumed fault position as the actual fault position if the second assumed fault position is in the second assumed fault section.

Or, solving a third distributed fault location equation set to determine a third assumed fault position if the first assumed fault position is outside the first assumed fault section, and taking the third assumed fault position as the actual fault position if the third assumed fault position is located in the first assumed fault section.

Optionally, the steps of constructing the plurality of distributed fault location equation sets according to the monitoring point coordinate information, the wavehead arrival time information, the assumed fault point information and the traveling wave propagation speed in each of the plurality of reference coordinate systems comprises the following steps.

Constructing a fault location general equation set.

Constructing the plurality of distributed fault location equation sets according to the fault location general equation set, and the monitoring point coordinate information, the wavehead arrival time information, the assumed fault section and the traveling wave propagation speed in each of the plurality of reference coordinate systems. The fault location general equation set is as follows:

$$\begin{cases} |x-x_0| = |t-t_0|v \\ |x-x_1| = |t-t_1|v \\ |x-x_2| = |t-t_2|v \\ \bullet \\ \bullet \\ |x-x_{i-1}| = |t-t_{i-1}|v \\ |x-x_i| = |t-t_i|v \end{cases}$$

where x is the assumed fault point coordinate, t is an assumed fault occurrence time, $x_0, x_1, \ldots, x_i$ is the monitoring point coordinate information, $t_0, t_1, \ldots, t_i$ is the wavehead arrival time information, and v is a traveling wave propagation speed.

Optionally, the steps of constructing the plurality of distributed fault location equation sets according to the monitoring point coordinate information, the wavehead arrival time information, the assumed fault point information and the traveling wave propagation speed in each of the plurality of reference coordinate systems comprises the following steps.

Constructing a fault location default equation set if the wavehead arrival time information is missing at some of the monitoring point positions.

Constructing the plurality of distributed fault location equation sets according to the fault location default system equation set, and the acquired monitoring point coordinate information, the wavehead arrival time information, the assumed fault section and the traveling wave propagation speed in each of the plurality of reference coordinate systems. The fault location default system equation set is as follows:

$$\begin{cases} |x-x| = |t-t_0|v \\ |x-x_1| = |t-t_1|v \\ |x-x_2| = |t-t_2|v \\ \bullet \\ \bullet \\ |x-x_{i-n}| = |t-t_{i-n}|v \end{cases}$$

where x is the assumed fault point coordinate; t is the assumed fault occurrence time, $x_0, x_1, \ldots, x_{i-n}$ is the monitoring point coordinate information, $t_0, t_1, \ldots, t_{i-n}$ is the wavehead arrival time information, n is a number the monitoring point positions for which the wavehead arrival time information is not acquired, and v is the traveling wave propagation speed.

Optionally, any of the monitoring points is arranged at one or more of a connection of a bus bar and a line, a connection of a cable and an overhead line of different line types, a connection of two lines with different line diameters, and a section with a line length being greater than a preset length and with a needed accurate location. Any of the monitoring point positions is arranged with a traveling wavehead monitoring sensor. The traveling wavehead monitoring sensor is configured to determine a wavehead arrival time of a corresponding monitoring point. The traveling wavehead monitoring sensor comprises a current type and a voltage type.

Optionally, the steps of determining an actual fault position according to the solution result of each of the plurality of distributed fault location equation sets and the assumed fault section comprises the following steps.

Determining the actual fault position by using a mathematical statistical method according to the solution result if the solution result of one of the plurality of distributed fault location equation sets all falls into an assumed fault section. The mathematical statistical method comprises at least one of an average method, a least squares method, a variance method and a mathematical expectation method.

In a second aspect, the present invention also provides a apparatus for locating a ring power network fault, comprising the following elements.

A first construction unit configured for expanding in each ring line segment with an arbitrary point as a coordinate origin in a ring power network to construct a plurality of reference coordinate systems, wherein the each ring line segment is a line segment between two adjacent monitoring point positions.

A first acquisition unit configured for acquiring monitoring point coordinate information and wavehead arrival time information of each of the monitoring point positions in each of the plurality of reference coordinate systems.

A second acquisition unit configured for acquiring assumed fault point information, wherein the assumed fault point information comprises an assumed fault point coordinate, assumed occurrence fault time and an assumed fault section.

A third acquisition unit configured for acquiring a traveling wave propagation speed.

A second construction unit configured for constructing a plurality of distributed fault location equation sets according to the monitoring point coordinate information, the wavehead arrival time information, the assumed fault point information and the traveling wave propagation speed in each of the plurality of reference coordinate systems.

A determination unit configured for determining an actual fault position according to a solution result of each of the plurality of distributed fault location equation sets and the assumed fault section.

In a third aspect, an electronic device includes a storage device, a processor and a computer program stored in the memory and running on the processor. The processor is used to execute the computer program stored in the memory to realize the steps of the method for locating the ring power network fault as described in any one of the first aspect.

In a fourth aspect, the invention also provides a computer readable storage medium having stored thereon a computer program, wherein the computer program, when executed by a processor, implements the method for locating the ring power network fault of any one of the first aspect.

The applied embodiments of the present invention have the following advantageous effects.

After adopting the method for locating the ring power network fault, the ring power network is expanded and the reference coordinate system is constructed. It is assumed that the traveling wave monitoring sensors at both ends of a certain section of line detect the traveling wave at both sides of the fault point respectively to expand from the segment of line, and then the position coordinate of the fault point is calculated by the traveling wave head arrival time and coordinate of the traveling wave head monitoring sensor, which makes up for the deficiency of the double-end traveling wave location for the ring network location. It provides a reliable, economical and accurate fault location method for complex AC/DC power transmission and distribution lines. The fault location equation of the ring network power line has easy writing and solving, which facilitates computer analysis and optimizes the current traveling wave location technology. In addition, the fault location equation of ring line is simple and reliable, which overcomes the problem that the traveling wave location devices should be installed at both ends of each ring line in the current traveling wave location methods.

BRIEF DESCRIPTION OF THE DRAWINGS

In order to more clearly describe the technical solutions in the embodiments of the invention or the prior art, the drawings to be used in the description of the embodiments or the prior art will be briefly introduced below. It will be apparent to those skilled in the art that the drawings in the following description are only some of the invention, and that other drawings may be obtained from the drawings without any creative works.

DESCRIPTION OF THE EMBODIMENTS

The technical solutions in the embodiments of the invention will be described clearly and completely in conjunction with the accompanying drawings in the embodiments of the invention. Obviously, the described embodiments are only part of the embodiments of the invention, rather than all of the embodiments. Based on the embodiments in the invention, all other embodiments obtained by a person skilled in the art without involving any inventive effort are within the scope of protection of the invention.

The terms "first", "second", "third", "fourth", and the like in the description and claims of the present application and in the above-described figures, if any, are used for distinguishing between similar objects and not necessarily for describing a particular sequential or chronological order. It should be understood that the data so used are interchangeable under appropriate circumstances such that the embodiments described herein can be implemented in other sequences than illustrated or described herein. Furthermore, the terms "comprise" and "comprising", as well as any variations thereof, are intended to cover a non-exclusive inclusion. For example, a process, a method, a system, an article, or a device that comprises a list of steps or elements is not necessarily limited to those steps or elements expressly listed, but may include other steps or elements not expressly listed or inherent to such process, method, article, or device. The technical solutions in the embodiments of the application will be described clearly and completely in conjunction with the accompanying drawings in the embodiments of the application. Obviously, the described embodiments are only part of the embodiments of the application, rather than all of the embodiments.

Figure 1:
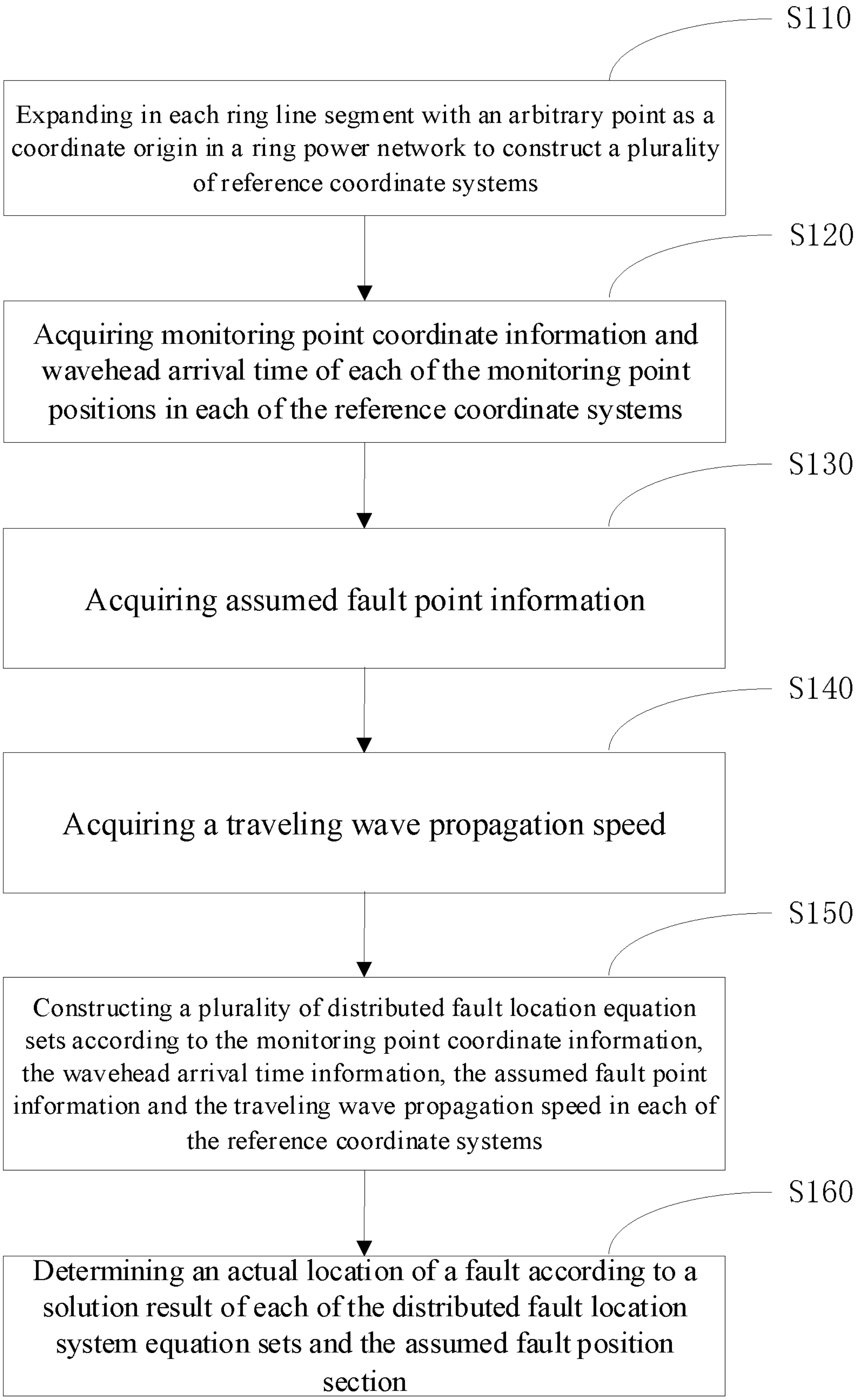
FIG. 1 is a schematic flow diagram of a method for locating a ring power network fault according to an embodiment of the present application.

With reference to FIG. 1, it is a schematic flow diagram of a method for locating a ring power network fault according to an embodiment of the present application, specifically including:

S110, expanding in each ring line segment with an arbitrary point as a coordinate origin in a ring power network to construct a plurality of reference coordinate systems, wherein the ring line segment is a line segment between two adjacent monitoring point positions.

Figure 2:
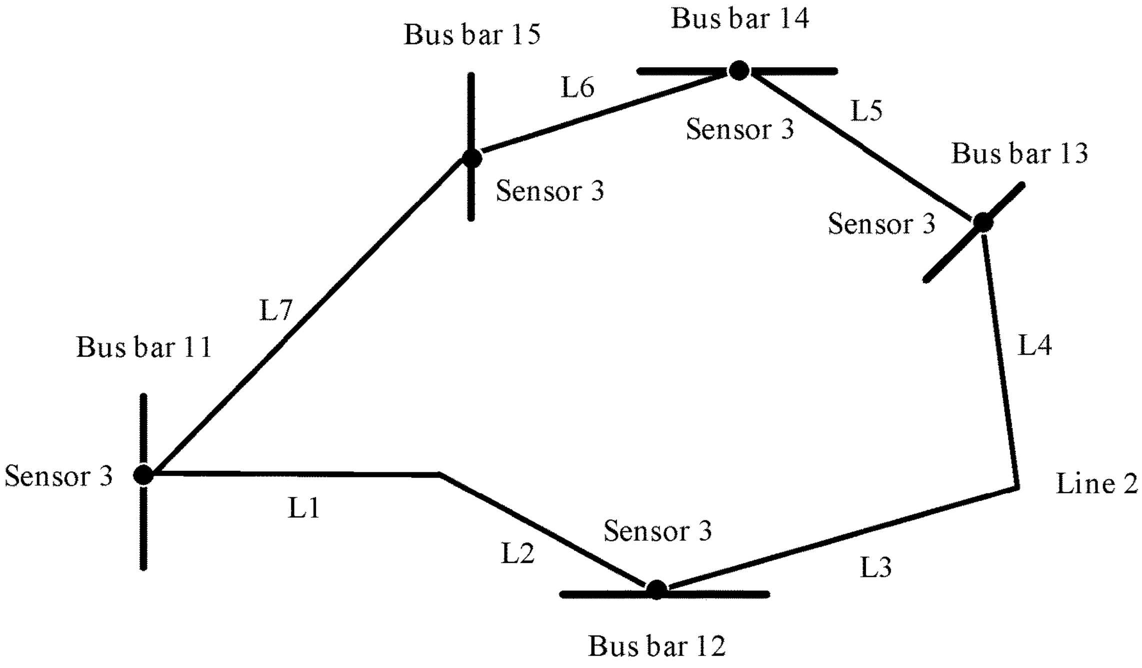
FIG. 2 is a schematic diagram of a ring power network provided by an embodiment of the present application.

As an example, the ring power network is composed of a plurality of bus bars and lines. As shown in FIG. 2, a schematic diagram of a possible ring power network is shown, including a bus bar 11, a bus bar 12, a bus bar 13, a bus bar 14, a bus bar 15 and a line 2. The line 2 is composed of seven segments, L1, L2, . . . , L7. As shown in FIG. 2, monitoring points are arranged at a junction of a bus bar and a ring line, and can also be arranged at a connection of a cable and an overhead line of different line types, a connection of two lines with different line diameters, and a section where a line length is greater than a preset length and it needs accurate location. The number of monitoring points can be adjusted according to the specific structure of the ring line and the required accuracy requirements for determining the fault point. The ring line segment is a line segment between two adjacent monitoring point positions. As shown in FIG. 2, the ring power network includes five ring line segments, namely, an L1+L2 segment, an L3+L4 segment, an L5 segment, an L6 segment and an L7 segment, and then the ring power network correspondingly has five expansion forms. The coordinate origin can be selected at will, preferably at the monitoring point position. It should be noted that the expansion form of the ring line is not limited to five. The present embodiment uses only FIG. 2 as an example to better illustrate the present scheme. The specific expanded form and the number of expanding are determined by the number of monitoring point positions in the actual ring line.

S120, acquiring monitoring point coordinate information and wavehead arrival time of each of the monitoring point positions in each of the reference coordinate systems.

By way of example, the wavehead arrival time can be acquired by installing a traveling wave head sensor on the monitoring point position. The wavehead monitoring sensor can be of a current type or a voltage type. A ring power supply line as shown in FIG. 2 is provided with a total of five sensors. The five sensors are used for measuring the arrival time of the traveling wave head. The traveling wave head sensor can send the measured traveling wave to a location host at a rear end via a wired or wireless communication mode. The location host processes the waveform so as to obtain the wavehead arrival time at the monitoring point position. The sensor has a fixed position in the ring line after installation. however, since the ring power network is expanded in different ways, and the origin of coordinates is selected in various ways, it can have various forms.

In a possible real-time manner, monitoring point coordinate information about a monitoring point position in a target monitoring point position reference coordinate system is acquired. Lengths $L_1$, $L_2$, $L_3$, $L_4$, $L_5$, $L_6$ and $L_7$ of the traveling wave head monitoring sensor 3 of the power network along the line 2 can be obtained according to FIG. 2. Assuming that the monitoring point position corresponding to the sensor at the side of the bus 11 is a coordinate origin, the coordinate origin is represented as $(x_0, t_0)$, and $x_0=0$.

Figure 3:
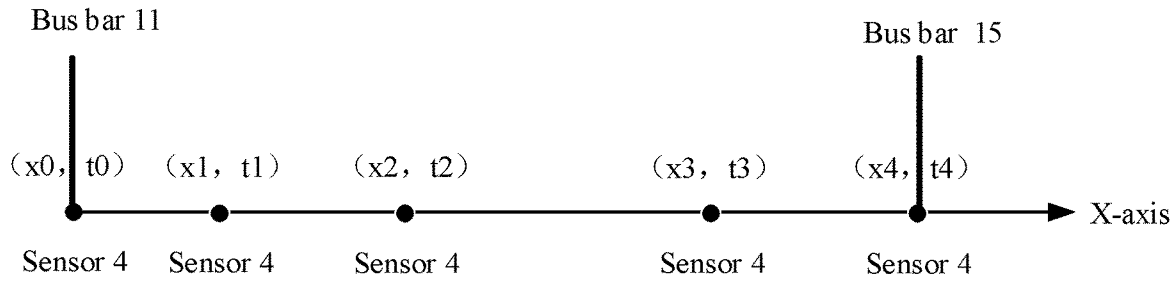
FIG. 3 is a schematic diagram of a first possible reference coordinate system provided by an embodiment of the present application.

As shown in FIG. 3, in a first possible reference coordinate system, in order to expand a ring power network in the segment L7 of the line, the coordinate positions of various traveling wave head monitoring sensors distributed along the ring power network line are denoted as $(x_1, t_1)$, $(x_2, t_2)$, $(x_3, t_3)$, $(x_4, t_4)$; where $x_1=L_1+L_2$, $x_2=L_1+L_2+L_3+L_4$, $x_3=L_1+L_2+L_3+L_4+L_5$, $x_4=L_1+L_2+L_3+L_4+L_5+L_6$; $x_1$, $x_2$, $x_3$ and $x_4$ are detection point coordinate information; and $t_1$, $t_2$, $t_3$ and $t_4$ are wavehead arrival times.

Figure 4:
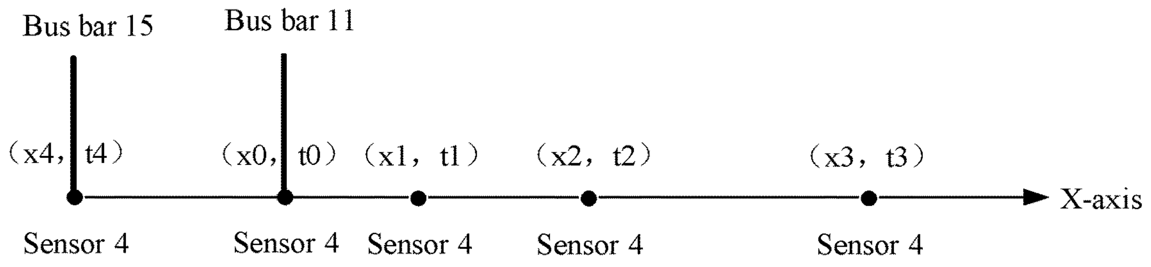
FIG. 4 is a schematic diagram of a second possible reference coordinate system provided for an embodiment of the present application.

As shown in FIG. 4, a second possible reference coordinate system is shown. In order to expand the ring power network in the segment L6 of the line, the coordinate positions of each traveling wave head monitoring sensor distributed along the ring power network line are denoted as $(x_1, t_1)$, $(x_2, t_2)$, $(x_3, t_3)$ and $(x_4, t_4)$; where $x_1=L_1+L_2$, $x_2=L_1+L_2+L_3+L_4$, $x_3=L_1+L_2+L_3+L_4+L_5$ and $x_4=-L_7$; $x_1$, $x_2$, $x_3$ and $x_4$ are detection point coordinate information, and $t_1$, $t_2$, $t_3$ and $t_4$ are wavehead arrival times.

Figure 5:
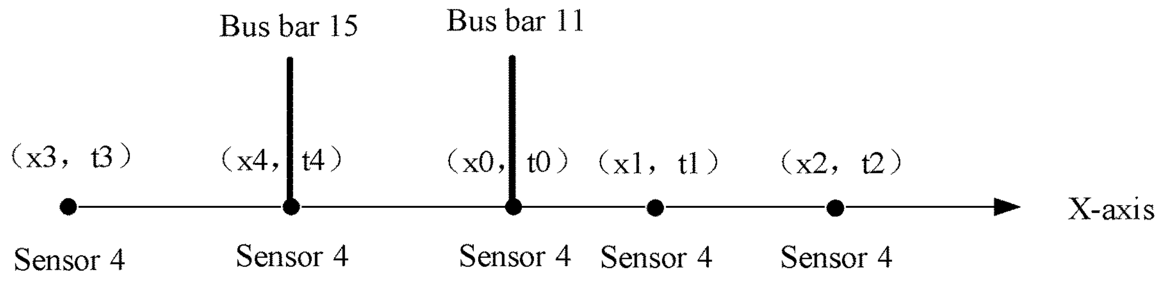
FIG. 5 is a schematic diagram of a third possible reference coordinate system provided for an embodiment of the present application.

As shown in FIG. 5, a third possible reference coordinate system is shown. In order to expand the ring power network in the segment L5 of the line, the coordinate positions of each traveling wave head monitoring sensors distributed along the ring power network line are denoted as $(x_1, t_1)$, $(x_2, t_2)$, $(x_3, t_3)$ and $(x_4, t_4)$; where $x_1=L_1+L_2$, $x_2=L_1+L_2+L_3+L_4$, $x_3=-L_6-L_7$ and $x_4=-L_7$; $x_1$, $x_2$, $x_3$ and $x_4$ are detection point coordinate information; and $t_1$, $t_2$, $t_3$ and $t_4$ are wavehead arrival times.

Figure 6:
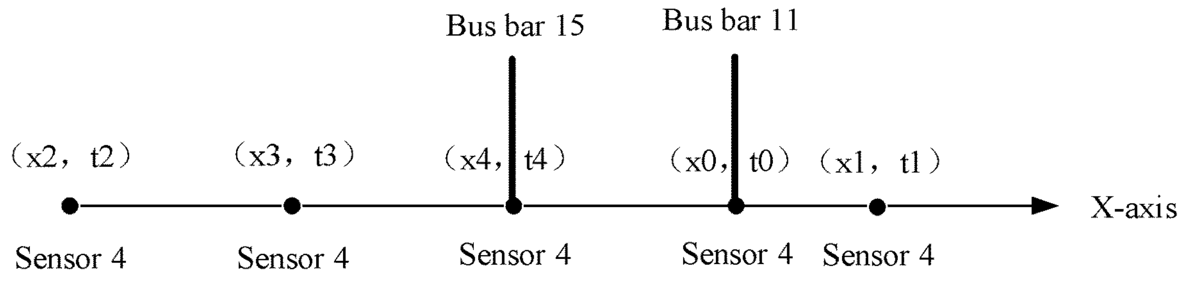
FIG. 6 is a schematic diagram of a fourth possible reference coordinate system provided by an embodiment of the present application.

As shown in FIG. 6, a fourth possible reference coordinate system is shown. In order to expand the ring power network in the segments L3 and L4 of the line, the coordinate positions of each traveling wave head monitoring sensors distributed along the ring power network line are denoted as $(x_1, t_1)$, $(x_2, t_2)$, $(x_3, t_3)$ and $(x_4, t_4)$; where $x_1=L_1+L_2$, $x_2=-L_5-L_6-L_7$, $x_3=-L_6-L_7$ and $x_4=-L_7$; $x_1$, $x_2$, $x_3$ and $x_4$ are detection point coordinate information; and $t_1$, $t_2$, $t_3$ and $t_4$ are wavehead arrival times.

Figure 7:
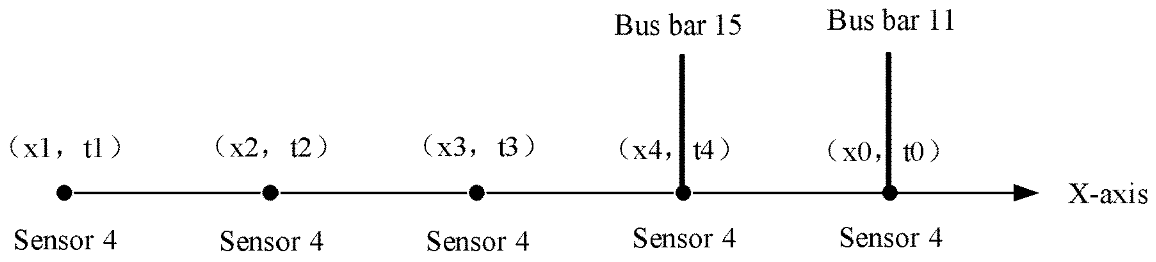
FIG. 7 is a schematic diagram of a fifth possible reference coordinate system provided by an embodiment of the present application.

As shown in FIG. 7, a fifth possible reference coordinate system is shown. In order to expand a ring power network in the segments L1 and L2 of the line, the coordinate positions of each traveling wave head monitoring sensor distributed along the ring power network line are denoted as $(x_1, t_1)$, $(x_2, t_2)$, $(x_3, t_3)$ and $(x_4, t_4)$; where $x_1=-L_3-L_4-L_5-L_6-L_7$, $x_2=-L_5-L_6-L_7$, $x_3=-L_6-L_7$ and $x_4=-L_7$; and $x_1$, $x_2$, $x_3$ and $x_4$ are wave head arrival times.

S130, acquiring assumed fault point information, wherein the assumed fault point information comprises an assumed fault point coordinate, assumed fault time and an assumed fault section.

Illustratively, the first assumed fault section may be arbitrarily assumed, such as occurring in L1 and L2 or any of an L3+L4 segment, an L5 segment, an L6 segment, and an L7 segment. The assumed fault point information includes an assumed fault point coordinate x, an assumed fault occurrence time t, and an assumed fault section.

S140, acquiring a traveling wave propagation speed.

Illustratively, the propagation speed of a traveling wave is related to the type of a ring power network. In the case of a transmission overhead line, the traveling wave propagation speed in each ring line segment in the line is the same. It is sufficient to determine one speed according to the type of the line. In the case of a hybrid ring power line, the traveling wave propagation speed in each ring line segment is different, and the traveling wave propagation speed in each ring line segment needs to be determined.

S150, constructing a plurality of distributed fault location equation sets according to the monitoring point coordinate information, the wavehead arrival time information, the assumed fault point information and the traveling wave propagation speed in each of the reference coordinate systems.

Illustratively, a distributed fault location equation set is constructed according to the detection point coordinate information, the wavehead arrival time information, the assumed fault point information and the traveling wave propagation speed in a reference coordinate system. A plurality of distributed fault location equation sets are formed due to different expanding positions of the constructed reference coordinate system in a ring power network and different assumed fault point information. Taking the ring power network shown in FIG. 2 as an example, the number of reference coordinate systems that can be established is five, and the number of possible assumed fault sections that may exist is four (since the reference coordinate system is expanded with a certain ring line segment, it is assumed in this reference coordinate system that the fault point cannot be in the expanded segment). In a case where the coordinate system origin is determined, each assumed fault section and each reference coordinate system can obtain an assumed fault position, namely, 20 distributed fault location equation sets may always occur.

S160, determining an actual fault position according to a solution result of each of the distributed fault location equation sets and the assumed fault section.

Illustratively, each distributed fault location equation set is solved. The obtained result is compared with an assumed fault section. The fault location equation set is a fault location equation set corresponding to the actual fault position only in a case where all the solution results of the fault location equation set fall within the assumed fault section. That is, only if a specific reference frame is used and the assumed fault area is selected, the obtained result can fall into the assumed fault section and the obtained result can be used to determine the actual fault position. Therefore, by solving each distributed fault location equation, and comparing the solution result with the assumed fault section until the solution result all falls into the assumed fault section, the obtained solution result is the actual fault position. Still taking the ring power network shown in FIG. 2 as an example, the actual fault position can be found at least once and at most 20 times.

In summary, according to the method provided in the embodiments of the present application, the ring power network is expanded and the reference coordinate system is constructed. It is assumed that the traveling wave monitoring sensors at both ends of a certain section of line detect the traveling wave at both sides of the fault point respectively to expand from the section of line, and then the traveling wave head arrival time and coordinate of the traveling wave head monitoring sensor are used by the traveling wave head to calculate the position coordinate of the fault point, which makes up for the deficiency of the double-end traveling wave location for the ring network location. It provides a reliable, economical and accurate fault location method for complex AC/DC power transmission and distribution lines. The fault location equation of the ring network power line has easy writing and solving, which facilitates computer analysis and optimizes the current traveling wave location technology. In addition, the fault location equation of ring line is simple and reliable, which overcomes the problem that the traveling wave location devices should be installed at both ends of each ring line in the current traveling wave location methods.

In some examples, the assumed fault section comprises a first assumed fault section; the reference coordinate system comprises a first reference coordinate system; the plurality of distributed fault location equation sets comprise a first distributed fault location equation set which is determined from the first assumed fault section, the traveling wave propagation speed, and the monitoring point position coordinate information and the wavehead arrival time information in the first reference coordinate system.

The determining an actual fault position according to a solution result of each of the distributed fault location equation sets and the assumed fault section comprises the following steps.

Solving the first distributed fault location equation set to determine a first assumed fault position.

Taking the first assumed fault position as the actual fault position in the case where the first assumed fault position is located in the first assumed fault section.

Illustratively, the reference coordinate system has various forms according to different expansion positions. The assumed fault section can be on a line between any two adjacent detection point position. The first reference coordinate system is one of the various forms, and the first assumed fault section is on a line between some two adjacent detection point positions. The first distributed fault location equation set is determined according to the first assumed fault section, the traveling wave propagation speed, and the detection point position coordinate information and the wavehead arrival time in the first reference coordinate system. The obtained result is a first assumed fault position by solving the first distributed fault location equation set. In a case where the first assumed position coordinate of the fault is located in a first assumed fault section, and the selected reference coordinate system and the assumed fault location section are correct, the actual fault position is determined by using the solution result of the first distributed fault location equation.

Figure 8:
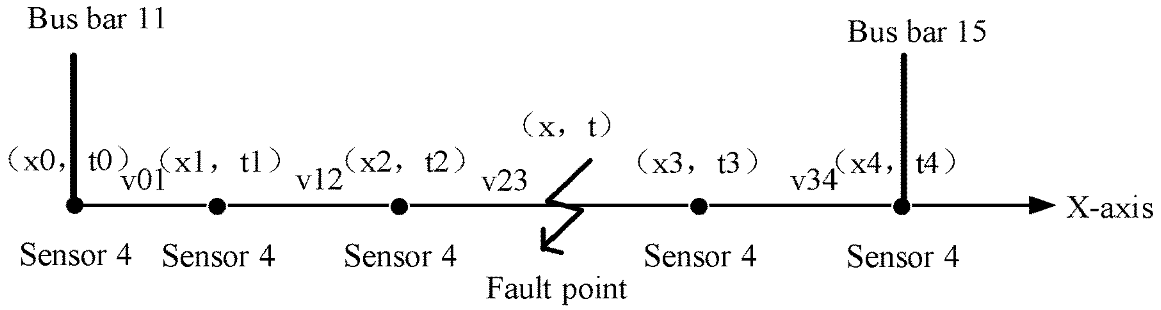
FIG. 8 is a schematic diagram of an assumed position of a possible fault point provided by an embodiment of the present application.

In some possible embodiments, as shown in the schematic diagram of a possible fault point assumed location shown in FIG. 8, the first reference coordinate system is developed in a ring power network expanded by a line L7 segment. The first assumed fault location segment is located between $x_2$ and $x_3$. Therefore, a first distributed location equation set is determined as Equation (A) based on th first fault assumed segment and the fault location general equation set.

$$\begin{cases} x - x_0 = (t_0 - t)v(0) \\ x - x_1 = (t_1 - t)v(1) \\ x - x_2 = (t_2 - t)v(2) \\ x_3 - x = (t_3 - t)v(3) \\ x_4 - x = (t_4 - t)v(4) \end{cases} \quad \text{(A)}$$

$$v_{01} = \frac{x_1 - x_0}{t_0 - t_1}$$

can be obtained from Equation (0) and Equation (1).

$$v_{02} = \frac{x_2 - x_0}{t_0 - t_2}$$

can be obtained from Equation (0) and Equation (2).

$$x_{03} = \frac{v(t_0 - t_3) + (x_0 + x_3)}{2}$$

can be obtained from Equation (0) and Equation (3).

$$x_{04} = \frac{v(t_0 - t_4) + (x_0 + x_4)}{2}$$

can be obtained from Equation (0) and Equation (4).

$$v_{12} = \frac{x_2 - x_1}{t_1 - t_2}$$

can be obtained from Equation (1) and Equation (2).

$$x_{13} = \frac{v(t_1 - t_3) + (x_1 + x_3)}{2}$$

can be obtained from Equation (1) and Equation (3).

$$x_{14} = \frac{v(t_1 - t_4) + (x_1 + x_4)}{2}$$

can be obtained from Equation (1) and Equation (4).

$$x_{23} = \frac{v(t_2 - t_3) + (x_2 + x_3)}{2}$$

can be obtained from Equation (2) and Equation (3).

$$x_{24}=\frac{v(t_2-t_4)+(x_2+x_4)}{2}$$

can be obtained from Equation (2) and Equation (4).

$$v_{34}=\frac{x_3-x_4}{t_3-t_4}$$

can be obtained from Equation (3) and Equation (4). If the calculated $x_{03}$, $x_{04}$, $x_{13}$, $x_{14}$, $x_{23}$ and $x_{24}$ are between $x_2$ and $x_3$, the fault point x is between $x_2$ and $x_3$. The first distributed location equation can then be used to solve the fault point position coordinate x. The result is found as the actual fault position. Any one of $x_{03}$, $x_{04}$, $x_{13}$, $x_{14}$, $x_{23}$ or the result from their comprehensive calculation is the first assumed fault position.

It should be noted that the traveling wave propagation speed may be different for different wiring modes. If it is a pure overhead line.

$v_{01}=v_{02}=v_{12}=v_{34}$, then $v=v_{01}=v_{02}=v_{12}=v_{34}$, the position coordinates of each sensor and the traveling wave head time arriving at the sensor are substituted to $$x_{03}=\frac{v(t_0-t_3)+(x_0+x_3)}{2},\ x_{04}=\frac{v(t_0-t_4)+(x_0+x_4)}{2},$$
$$x_{13}=\frac{v(t_1-t_3)+(x_1+x_3)}{2},\ x_{14}=\frac{v(t_1-t_4)+(x_1+x_4)}{2},$$
$$x_{23}=\frac{v(t_2-t_3)+(x_2+x_3)}{2},\ x_{24}=\frac{v(t_2-t_4)+(x_2+x_4)}{2}$$

to obtain $x_{03}$, $x_{04}$, $x_{13}$, $x_{14}$, $x_{23}$, $x_{24}$.

If it is a hybrid ring power line, $v\neq v_{01}\neq v_{02}\neq v_{12}\neq v_{34}$, $v_{01}$, $v_{12}$ and $v_{34}$ are substituted into the following equation to obtain $v_{23}$, $x_{03}$, $x_{04}$, $x_{13}$, $x_{14}$, $x_{23}$, $x_{24}$.

$$x_{03}=\frac{v(t_0-t_3)+(x_0+x_3)}{2}=\frac{v_{01}(t_0-t_1)+v_{12}(t_1-t_2)+v_{23}(t_2-t_3)+(x_0+x_3)}{2}$$

$$x_{04}=\frac{v(t_0-t_4)+(x_0+x_4)}{2}=\frac{v_{01}(t_0-t_1)+v_{12}(t_1-t_2)+v_{23}(t_2-t_3)+v_{34}(t_3-t_4)+(x_0+x_4)}{2}$$

$$x_{13}=\frac{v(t_1-t_3)+(x_1+x_3)}{2}=\frac{v_{12}(t_1-t_2)+v_{23}(t_2-t_3)+(x_1+x_3)}{2}$$

$$x_{14}=\frac{v(t_1-t_4)+(x_1+x_4)}{2}=\frac{v_{12}(t_1-t_2)+v_{23}(t_2-t_3)+v_{34}(t_3-t_4)+(x_1+x_3)}{2}$$

$$x_{23}=\frac{v(t_2-t_3)+(x_2+x_3)}{2}=\frac{v_{23}(t_2-t_3)+(x_2+x_3)}{2}$$

$$x_{24}=\frac{v(t_2-t_4)+(x_2+x_4)}{2}=\frac{v_{23}(t_2-t_3)+v_{34}(t_3-t_4)+(x_2+x_4)}{2}$$

In some examples, the assumed fault section further comprises an assumed fault section; the reference coordinate system further comprises a second reference coordinate system; the plurality of distributed fault location equation sets further comprise a second distributed fault location equation set and a third distributed fault location equation set; the second distributed fault location equation is determined according to the second assumed fault section, the traveling wave propagation speed, and the monitoring point position coordinate information and the wave head arrival time information in the first reference coordinate system; the third distributed fault location equation set is determined according to the first assumed fault section, the traveling wave propagation speed, and the monitoring point position coordinate information and the wave head arrival time information in the second reference coordinate system;

The above method further comprises the following steps.

Solving a second distributed fault location system of equations to determine a second assumed fault position if the first assumed fault position is outside the first assumed fault section, and taking the second assumed fault position as the actual fault position if the second assumed fault position is in the second assumed fault section.

Or, solving a third distributed fault location equation set to determine a third assumed fault position if the first assumed fault position is outside the first assumed fault section, and taking the third assumed fault position as the actual fault position in the case where the third assumed fault position is located in the first assumed fault section.

Illustratively, if the first assumed position obtained is outside the assumed fault section, the assumed section selected may be not the position where the actual fault occurs and/or the expanded location of the selected ring circuit network obtained is not correct, then the other assumed fault section should be selected to determine a second distributed fault location equation set, or a second reference coordinate system corresponding to the other expanded form is selected. The second assumed position is obtained based on the second reference coordinate system until the second assumed position falls within the second assumed fault section.

In some possible embodiments, the fault point position is determined by the following processes.

S210, the first reference coordinate system is developed in a ring power network expanded by a line L7 segment; a first assumed fault segment is located between $x_0$ and $x_1$, namely, assuming that a fault point occurs between $x_0$ and $x_1$; the first distributed fault location equation when all the traveling wave head sensors are normal is Equation (B).

$$\begin{cases} x-x_0=(t_0-t)v(0)\\ x_1-x=(t_1-t)v(1)\\ x_2-x=(t_2-t)v(2)\\ x_3-x=(t_3-t)v(3)\\ x_4-x=(t_4-t)v(4) \end{cases} \tag{B}$$

$$x_{01}=\frac{v(t_0-t_1)+(x_0+x_1)}{2}$$

can be obtained from equation (0) and equation (1).

$$x_{02}=\frac{v(t_0-t_2)+(x_0+x_2)}{2}$$

can be obtained from equation (0) and equation (2).

$$x_{03}=\frac{v(t_0-t_3)+(x_0+x_3)}{2}$$

can be obtained from equation (0) and equation (3).

$$x_{04}=\frac{v(t_0-t_4)+(x_0+x_4)}{2}$$

can be obtained from equation (0) and equation (4).

$$v_{12}=\frac{x_1-x_2}{t_1-t_2}$$

can be obtained from equation (1) and equation (2).

$$v_{13}=\frac{x_1-x_3}{t_1-t_3}$$

can be obtained from equation (1) and equation (3).

$$v_{14}=\frac{x_1-x_4}{t_1-t_4}$$

can be obtained from equation (1) and equation (4).

$$v_{23}=\frac{x_2-x_3}{t_2-t_3}$$

can be obtained from equation (2) and equation (3).

$$v_{24}=\frac{x_2-x_4}{t_2-t_4}$$

can be obtained from equation (2) and equation (4).

$$v_{34}=\frac{x_3-x_4}{t_3-t_4}$$

can be obtained from equation (3) and equation (4). If the calculated that $x_{01}$, $x_{02}$, $x_{03}$, $x_{04}$ are not between "$x_0$ and $x_1$", the fault point x is not between $x_0$ and $x_1$, and then the assumed fault occurrence section is wrong.

S220, the assumed fault section is changed; the second assumed fault section is located between $x_1$ and $x_2$, namely, the assumed fault point occurs between $x_1$ and $x_2$; the second distributed fault location equation when all the traveling wave head sensors are normal is Equation (C).

$$\begin{cases}x-x_0=(t_0-t)v(0)\\x-x_1=(t_1-t)v(1)\\x_2-x=(t_2-t)v(2)\\x_3-x=(t_3-t)v(3)\\x_4-x=(t_4-t)v(4)\end{cases}$$

$$v_{01}=\frac{x_1-x_0}{t_0-t_1}$$

can be obtained from equation (0) and equation (1).

$$x_{02}=\frac{v(t_0-t_2)+(x_0+x_2)}{2}$$

can be obtained from from equation (0) and equation (2).

$$x_{03}=\frac{v(t_0-t_3)+(x_0+x_3)}{2}$$

can be obtained from equation (0) and equation (3).

$$x_{04}=\frac{v(t_0-t_4)+(x_0+x_4)}{2}$$

can be obtained from equation (0) and equation (4).

$$x_{12}=\frac{v(t_1-t_2)+(x_1+x_2)}{2}$$

can be obtained from equation (1) and equation (2).

$$x_{13}=\frac{v(t_1-t_3)+(x_1+x_3)}{2}$$

can be obtained from equation (1) and equation (3).

$$x_{14}=\frac{v(t_1-t_4)+(x_1+x_4)}{2}$$

can be obtained from equation (1) and equation (4).

$$v_{23}=\frac{x_2-x_3}{t_2-t_3}$$

can be obtained from equation (2) and equation (3).

$$v_{24}=\frac{x_2-x_4}{t_2-t_4}$$

can be obtained from equation (2) and equation (4).

$$v_{34}=\frac{x_3-x_4}{t_3-t_4}$$

can be obtained from equation (3) and equation (4). If the calculated $x_{02}$, $x_{03}$, $x_{04}$, $x_{12}$, $x_{13}$, $x_{14}$ are not between $x_1$ and $x_2$, the assumed fault occurrence section is still wrong.

S230, the position of the assumed fault section is changed again; a second assumed fault section is located between $x_2$ and $x_3$, namely, the assumed fault point occurs between $x_2$ and $x_3$; the second distributed fault location equation when all the traveling wave head sensors are normal is Equation (D).

$$\begin{cases} x-x_0=(t_0-t)v(0) \\ x-x_1=(t_1-t)v(1) \\ x-x_2=(t_2-t)v(2) \\ x_3-x=(t_3-t)v(3) \\ x_4-x=(t_4-t)v(4) \end{cases} \quad (D)$$

$$v_{01}=\frac{x_1-x_0}{t_0-t_1}$$

can be obtained from Equation (0) and Equation (1).

$$v_{02}=\frac{x_2-x_0}{t_0-t_2}$$

can be obtained from Equation (0) and Equation (2).

$$x_{03}=\frac{v(t_0-t_3)+(x_0+x_3)}{2}$$

can be obtained from Equation (0) and Equation (3).

$$x_{04}=\frac{v(t_0-t_4)+(x_0+x_4)}{2}$$

can be obtained from Equation (0) and Equation (4).

$$v_{12}=\frac{x_2-x_1}{t_1-t_2}$$

can be obtained from Equation (1) and Equation (2).

$$x_{13}=\frac{v(t_1-t_3)+(x_1+x_3)}{2}$$

can be obtained from Equation (1) and Equation (3).

$$x_{14}=\frac{v(t_1-t_4)+(x_1+x_4)}{2}$$

can be obtained from Equation (1) and Equation (4).

$$x_{23}=\frac{v(t_2-t_3)+(x_2+x_3)}{2}$$

can be obtained from Equation (2) and Equation (3).

$$x_{24}=\frac{v(t_2-t_4)+(x_2+x_4)}{2}$$

can be obtained from Equation (2) and Equation (4).

$$v_{34}=\frac{x_3-x_4}{t_3-t_4}$$

can be obtained from Equation (3) and Equation (4). If the calculated $x_{03}$, $x_{04}$, $x_{13}$, $x_{14}$, $x_{23}$ and $x_{24}$ are between $x_2$ and $x_3$, the fault point x is set to be between $x_2$ and $x_3$.

Thus, the fault point x is then between $x_2$ and $x_3$. Any one of $x_{03}$, $x_{04}$, $x_{13}$, $x_{14}$, $x_{23}$ or the result from their comprehensive calculation is the first assumed fault position.

It can be seen from steps S210 to S230 that in a case where the first assumed fault position is located outside the first assumed fault section, namely, the assumed fault section selected may be wrong. The second assumed fault section is obtained by replacing the assumed fault section. The second distributed fault location equation is established. The second distributed fault location equation is solved until all the obtained results fall within the second assumed fault section, namely, the obtained results can be used for determining the actual fault position. It will be appreciated that the second assumed fault section is not a single fault section, but the remaining assumed fault sections that differ from the first assumed fault section.

In addition, in a case where the first assumed fault position is located outside the first assumed fault section, it may also be caused by the selected expanding position, namely, the selected reference coordinate system is wrong. The reference coordinate system may be changed to obtain a second reference coordinate system. A third distributed fault location equation is established based on the second reference coordinate system. The third distributed fault location equation is solved until all the obtained results fall within the first assumed fault section, namely, the obtained results may be used for determining the actual fault position. It will be appreciated that the second reference system is not a single fault section, but the remaining reference coordinate systems that differ from the first reference coordinate system.

It should be noted that in the actual calculation process, there may be a phenomenon that it is still impossible to make all the obtained results fall into the assumed fault section when the reference coordinate system or the assumed fault section is changed alone. At this moment, the reference coordinate system and the assumed fault section need to be replaced at the same time, so as to traverse the combination of all the reference coordinate systems and the assumed fault section to construct a distributed fault location equation. When all the obtained results fall into the assumed fault section, the selected reference coordinate system and the assumed fault section are correct at this time, and then the distributed fault location equation can be used to solve the actual fault position.

In some examples, the constructing a plurality of distributed fault location equation sets according to the monitoring point coordinate information, the wavehead arrival time information, the assumed fault point information and the traveling wave propagation speed in each of the reference coordinate systems includes the following steps.

Constructing a fault location general equation set.

Constructing a plurality of distributed fault location equation sets according to the fault location general equation set, and the monitoring point coordinate information, the wavehead arrival time information, the assumed fault section and the traveling wave propagation speed in each of the reference coordinate systems, wherein the fault location general equation set is as follows.

$$\begin{cases} |x-x_0| = |t-t_0|v \\ |x-x_1| = |t-t_1|v \\ |x-x_2| = |t-t_2|v \\ \cdot \\ \cdot \\ |x-x_{i-1}| = |t-t_{i-1}|v \\ |x-x_i| = |t-t_i|v \end{cases}$$

where x is an assumed fault point coordinate; t is an assumed fault occurrence time of the fault, $x_0, x_1, \ldots, x_i$ is monitoring point coordinate information, $t_0, t_1, \ldots, t_i$ is wavehead arrival time information, and v is a traveling wave propagation speed.

Illustratively, the present embodiment provides a fault location general equation set as shown in Equation (E):

$$\begin{cases} |x-x_0| = |t-t_0|v \\ |x-x_1| = |t-t_1|v \\ |x-x_2| = |t-t_2|v \\ \cdot \\ \cdot \\ |x-x_{i-1}| = |t-t_{i-1}|v \\ |x-x_i| = |t-t_i|v \end{cases} \tag{E}$$

where x is an assumed fault point coordinate; t is an assumed fault occurrence time of the fault, $x_0, x_1, \ldots, x_i$ is monitoring point coordinate information, $t_0, t_1, \ldots, t_i$ is wavehead arrival time information, and v is a traveling wave propagation speed.

According to the fault location general equation set, the monitoring point coordinate information and the wavehead arrival time information are brought into the fault location general equation set in different reference systems. The absolute value sign is solved according to the positions of different assumed fault sections to establish a distributed fault location equation set. The actual fault position is determined by solving a plurality of distributed fault location equation sets.

In some examples, the constructing a plurality of distributed fault location equation sets according to the monitoring point coordinate information, the wavehead arrival time information, the assumed fault point information and the traveling wave propagation speed in each of the reference coordinate systems includes the following steps.

Constructing a fault location default equation set in the case where the wavehead arrival time is missing at some monitoring point positions.

Constructing a plurality of distributed fault location equation sets according to the fault location default system equation set, and the acquired monitoring point coordinate information, the wavehead arrival time information, the assumed fault section and the traveling wave propagation speed in each of the reference coordinate systems, wherein the fault location default system equation set is as follows.

$$\begin{cases} |x-x_0| = |t-t_0|v \\ |x-x_1| = |t-t_1|v \\ |x-x_2| = |t-t_2|v \\ \cdot \\ \cdot \\ |x-x_{i-n}| = |t-t_{i-n}|v \end{cases}$$

where x is the assumed fault point coordinate; t is the assumed fault occurrence time of the fault; $x_0, x_1, \ldots, x_{i-n}$ is monitoring point coordinate information; $t_0, t_1, \ldots, t_{i-n}$ is wavehead arrival time information; n is the number of monitoring point positions for which the wavehead arrival time is not acquired; and v is the traveling wave propagation speed.

Illustratively, in practical engineering applications, there may be some traveling wave head monitoring apparatuses operating abnormally, resulting in the wavehead arrival time not being acquired at some monitoring points. This embodiment addresses this phenomenon. A fault location default equation set is provided as shown in Equation (F):

$$\begin{cases} |x-x_0| = |t-t_0|v \\ |x-x_1| = |t-t_1|v \\ |x-x_2| = |t-t_2|v \\ \cdot \\ \cdot \\ |x-x_{i-1}| = |t-t_{i-1}|v \\ |x-x_i| = |t-t_i|v \end{cases} \tag{F}$$

where x is the assumed fault point coordinate; t is the assumed fault occurrence time of the fault, $x_0, x_1, \ldots, x_{i-n}$ is monitoring point coordinate information, $t_0, t_1, \ldots, t_{i-n}$ is wavehead arrival time information, n is the number of monitoring point positions for which the wavehead arrival time is not acquired, and v is the traveling wave propagation speed.

According to the fault location default equation set, even in a case where the arrival time of traveling wave head is not obtained at some monitoring point positions, the monitoring point coordinate information can be brought into the fault location default equation set according to the remaining wave head arrival time information and the corresponding information in different reference systems. The absolute value sign is solved according to the positions of different assumed fault sections so as to establish a distributed fault location equation set. The actual fault position can be determined by solving a plurality of distributed fault location equation sets. It should be noted that the method for determining the actual fault position is still achieved by continuously changing the reference coordinate system and the assumed fault section, and comparing the obtained result with the assumed position section, which will not be described in detail herein.

In a possible embodiment, as shown in FIG. 8, a reference coordinate system is constructed by expanding a segment $L_7$ line. A fault point position coordinate is set as x and a fault occurrence time is set as t. A traveling wave arrival time $t_3$ is absent in practical applications. According to the received wave head arrival time, a fault location default equation set is expressed as the Equation (G):

$$\begin{cases} |x-x_0| = |t-t_0|v \\ |x-x_1| = |t-t_1|v \\ |x-x_2| = |t-t_2|v \\ |x-x_4| = |t-t_4|v \end{cases} \tag{G}$$

Figure 9:
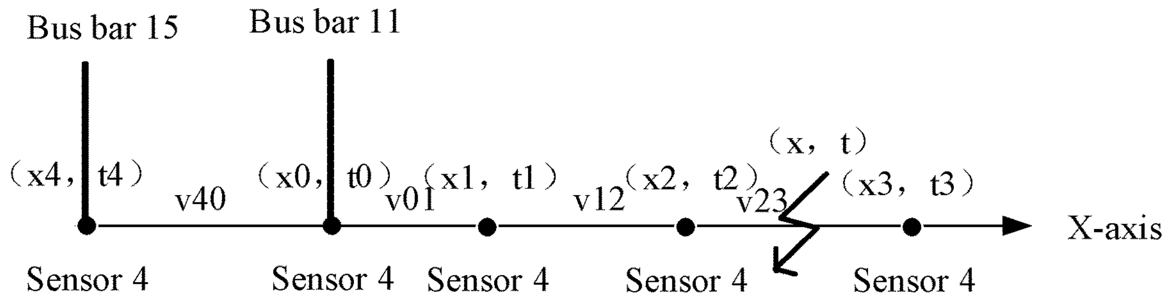
FIG. 9 is a schematic diagram of an assumed position of another possible fault point provided by an embodiment of the present application.

By the same reasoning, as shown in FIG. 9, a reference coordinate system can be constructed by expanding a segment $L_6$ line. It can be understood that in practical applications, there may also be a part of traveling wave sensors not receiving the traveling wave head arrival time, for example, lacking a traveling wave arrival time $t_2$. Thus, a fault location default equation set is expressed as Equation (H).

$$\begin{cases} |x-x_0| = |t-t_0|v \\ |x-x_1| = |t-t_1|v \\ |x-x_2| = |t-t_3|v \\ |x-x_4| = |t-t_4|v \end{cases} \quad \text{(H)}$$

In practical engineering applications, there may be a phenomenon that some monitoring point positions cannot obtain the wavehead arrival time, or the wavehead arrival time is lost. According to the method proposed in the present application, even in a case where some monitoring point positions do not obtain the traveling wave head arrival time, by means of the fault location default equation set, the monitoring point coordinate information can be brought into the fault location default equation set for solving according to the remaining wave head arrival time information and the corresponding coordinate information thereof in different reference systems so as to obtain the actual fault position. That is, by this method, if the arrival time of any traveling wave monitoring sensor is lost, only one equation is lost. The form of equations is not affected. The fault point and the traveling wave speed of each line can be easily calculated, which has a strong engineering practice prospect.

In some examples, the monitoring point is provided at one or more of a connection of a bus bar and a line, a connection of a cable and an overhead line of different line types, a connection of two lines with different line diameters, and a section where a line length is greater than a preset length and it needs accurate location; wherein the monitoring point position is provided with a traveling wavehead monitoring sensor; the traveling wavehead monitoring sensor is used for determining the wavehead arrival time of a corresponding monitoring point; and the traveling wavehead monitoring sensor comprises a current type and a voltage type.

Illustratively, the monitoring point may be provided at one or more of a connection of a bus bar and a line, a connection of a cable and an overhead line of different line types, a connection of two lines with different line diameters, and a section where a line length is greater than a preset length and it needs accurate location. The predetermined length may be determined based on the specific accuracy requirements of the detection. The monitoring point position is provided with a traveling wave head monitoring sensor which is used for determining the wavehead arrival time corresponding to the monitoring point and can acquire traveling wave in a line so as to determine the wavehead arrival time. It needs to be explained that the operation of acquiring the wavehead arrival time can be completed by the traveling wave head monitoring sensor and the wavehead arrival time is transmitted to the location host. It can also be acquired by the location host by acquiring the traveling wave acquired by the traveling wave head monitoring sensor and performing data processing by the location host. The traveling wave head monitoring sensor includes a current type and a voltage type.

In some examples, the determining an actual fault position according to a solution result of each of the distributed fault location equation sets and the assumed fault section includes the following steps.

Determining the actual fault position by using a mathematical statistical method according to a solution result in a case where the solution result of one of the distributed fault location equation sets all falls into the fault section, wherein the data statistical method comprises at least one of an average method, a least squares method, a variance method and a mathematical expectation method.

Illustratively, any two expressions as described in the above-mentioned embodiment can obtain a calculation result. Theoretically, each calculation result should be the same. However, due to the influence of environmental factors, the propagation of a traveling wave in each section of a line may be influenced by environmental influences so as to affect the calculation result. In this embodiment, the calculation results obtained by any two fault location equations are integrated to perform statistics, and reasonable results are analyzed and processed to eliminate the influence of environmental factors on the measurement result, so as to obtain a more accurate fault location. A more accurate fault location can be obatined by performing data statistics on the results obtained by any two fault location equations so as to obtain. The data statistics method includes one or more of an average method, a least square method, a variance method and a mathematical expectation method, so as to determine a result with a stronger correlation and a smaller error on data, thereby eliminating the error in measurement to make the fault position more accurate.

For example, an average method can be used to calculate the coordinate of a line fault point:

$$x = \frac{x_{03} + x_{04} + x_{13} + x_{14} + x_{23} + x_{24}}{6}$$

An exact location of the fault point of the above embodiment is then at the position of $L=x-L_1-L_2-L_3-L_4$ of the segment $L_5$ of the line.

In some examples, the position of the traveling wave fault may be determined by a traveling wave fault location calculation system including the following elements.

A traveling wave location sensor and a location host arranged on a power transmission and distribution line of a ring power network, the location host including a communication module, a data processing module, a location calculation module and an output display module. The traveling wave location sensor is arranged on the power transmission and distribution line and used for monitoring a voltage or current traveling wave of the power line. The location host communication module is used for communicating with the traveling wave location sensor to obtain an initial moment or a traveling wave waveform when the traveling wave reaches each distributed traveling wave sensor. The data processing module is used for processing data such as an initial moment of a traveling wave and a traveling wave waveform. The location calculation module is used for solving a distributed fault location calculation equation to obtain an optimal solution. The output display module is used for displaying a point, a fault point, a coordinate and fault distance information of the distributed sensor arrangement of the power transmission and distribution lines.

Figure 10:
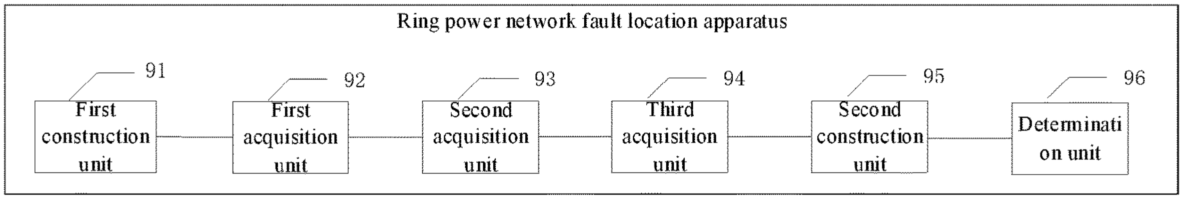
FIG. 10 is a schematic structural diagram of an apparatus for locating a ring power network fault provided by an embodiment of the present application.

With reference to FIG. 10, it shows one embodiment of an apparatus for locating a ring power network fault in the embodiment of the present application, including the following elements.

A first construction unit 91 for expanding in each ring line segment with an arbitrary point as a coordinate origin in a ring power network to construct a plurality of reference coordinate systems, wherein the ring line segment is a line segment between two adjacent monitoring point positions.

A first acquisition unit 92 configured for acquiring monitoring point coordinate information and wavehead arrival time of each of the monitoring point positions in each of the reference coordinate systems.

A second acquisition unit 93 configured for acquiring assumed fault point information, wherein the assumed fault point information comprises an assumed fault point coordinate, assumed fault time and an assumed fault section.

A third acquisition unit 94 configured for acquiring a traveling wave propagation speed.

A second construction unit 95 configured for constructing a plurality of distributed fault location equation sets according to the monitoring point coordinate information, the wavehead arrival time information, the assumed fault point information and the traveling wave propagation speed in each of the reference coordinate systems.

A determination unit 96 configured for determining an actual fault position according to a solution result of each of the distributed fault location equation sets and the assumed fault section.

Figure 11:
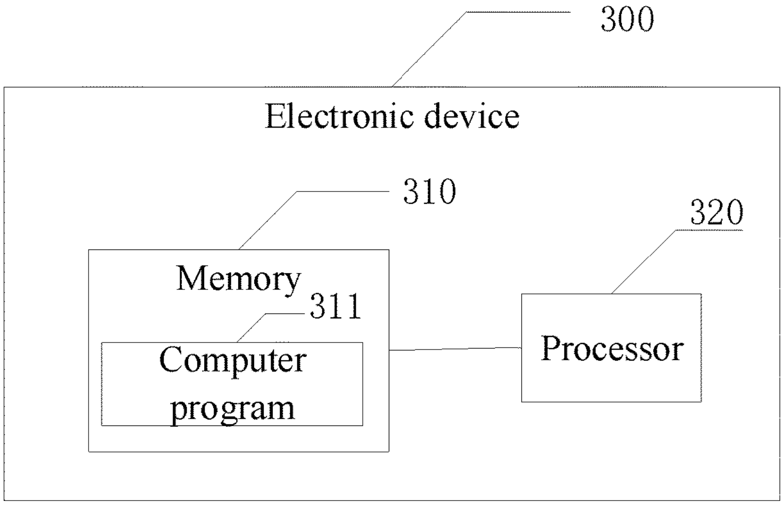
FIG. 11 is a schematic structural diagram of an electronic device for locating a ring power network fault provided by an embodiment of the present application.

As shown in FIG. 11, embodiments of the present application also provide an electronic device 300 including a memory 310, a processor 320, and a computer program 311 stored on the memory 320 and executable on the processor. The computer program 311 when executed by the processor 320 implements the steps of any of the methods for locating a ring power network fault described above.

Since the electronic device described in the present embodiment is a device used for implementing a temperature control device for the apparatus for locating a ring power network fault in the embodiments of the present application. Therefore, based on the method described in the embodiments of the present application, a person skilled in the art would have been able to learn the particular implementation of the electronic device of the present embodiment and various modifications thereof. Therefore, how to implement the method in the embodiments of the present application by the electronic device is not described in detail herein. Any device used by a person skilled in the art for implementing the method in the embodiments of the present application falls within the scope of protection of the present application.

In a specific implementation, the computer program 311, when executed by the processor, may implement any implementation of the corresponding embodiments of FIG. 1.

It should be noted that in the above-mentioned embodiments, the description of each embodiment has its own emphasis, and parts of one embodiment which are not described in detail may be referred to the description of other embodiments.

Those skilled in the art will appreciate that embodiments of the present application may be provided as a method, a system, or a computer program product. Thus, the present application may take the form of an entire hardware embodiment, an entire software embodiment, or an embodiment combining software and hardware aspects. Moreover, the present application may take the form of a computer program product embodied on one or more computer-usable storage media (including, but not limited to, magnetic disk storage, CD-ROM, optical storage, and the like) having computer-usable program code embodied therein.

The present application is described with reference to flowcharts and/or a block diagrams of methods, devices (systems), and computer program products according to embodiments of the present application. It will be understood that each flow and/or block of the flowcharts and/or block diagrams in combination with flows and/or blocks in the flowcharts and/or block diagrams can be implemented by computer program instructions. These computer program instructions may be provided to a processor of a general purpose computer, a special purpose computer, an embedded computer/other data processing devices to produce a machine, such that the instructions executed via the processor of the computer or other programmable data processing devices create means for implementing the functions specified in the flowchart flow or flows and/or block diagram block or blocks.

These computer program instructions may also be stored in a computer-readable memory that can direct a computer or other programmable data processing devices to function in a particular manner, such that the instructions stored in the computer-readable memory produce an article of manufacture including instruction means which implement the function specified in the flowchart flow or flows and/or block diagram block or blocks.

These computer program instructions may also be loaded onto a computer or other programmable data processing devices to cause a series of operational steps to be performed on the computer or other programmable devices to produce a computer implemented process, such that the instructions executed on the computer or other programmable devices provide steps for implementing the functions specified in the flowchart flow or flows and/or block diagram block or blocks.

Embodiments of the present application also provide a computer program product including computer software instructions which, when run on a processing device, cause the processing device to perform the method for locating a ring power network fault as in the corresponding embodiment of FIG. 1.

The computer program product includes one or more computer instructions. When the computer program instructions are loaded and executed on a computer, it generates, in whole or in part, processes or functions according to embodiments of the present application. The computer may be a general purpose computer, a special purpose computer, a computer network, or other programmable apparatus. The computer instructions may be stored in a computer-readable storage medium or transmitted from one computer-readable storage medium to another computer-readable storage medium. For example, the computer instructions may be transmitted from a website, a computer, a server, or a data center to another website, computer, server, or data center by a wired manner (e.g., coaxial cable, fiber optic, digital subscriber line, DSL) or a wireless manner (e.g., infrared, wireless, microwave, etc.). The computer-readable storage medium can be any available medium that can be used for storage by a computer or a data storage device including a server, data center, or the like integrated by one or more available media. The available medium may be a magnetic medium (e.g., floppy disk, hard disk, magnetic tape), an optical medium (e.g., DVD), or a semiconductor medium (e.g., solid state disk, SSD), etc.

It will be obvious to a person skilled in the art that, for the convenience and brevity of the description, specific working procedures of the above described systems, devices and units may be referred to corresponding procedures in the preceding method embodiments and will not be described in detail here.

In the several embodiments provided herein, it should be understood that the disclosed system, device, and method may be implemented in other ways. For example, the apparatus embodiments described above are merely illustrative. For example, the partitioning of elements is merely a logical function partitioning, and actual implementations may have additional partitioning, e.g., multiple elements or components may be combined or integrated into another system, or some features may be omitted, or not performed. In another aspect, the couplings or direct couplings or communication connections shown or discussed with respect to each other may be indirect couplings or communication connections via some interface, apparatus, or unit, and may be electrical, mechanical, or other forms.

The elements illustrated as separate elements may or may not be physically separate, and the components shown as elements may or may not be physical elements, i.e., may be located at one place, or may be distributed across multiple network elements. Some or all of the elements can be selected according to actual needs to achieve the purpose of the solution of the embodiment.

In addition, each functional unit in each embodiment of the present application may be integrated in one processing unit, or may be physically present separately from each unit. Two or more units may be integrated in one unit. The above-mentioned integrated units may be implemented in the form of hardware or in the form of software functional units.

The integrated unit, if implemented in the form of a software functional unit and sold or used as a stand-alone product, may be stored in a computer-readable storage medium. Based on this understanding, the solution of the application may be essentially or a part of making a contribution to the prior art or a whole or part of the solution may be embodied in the form of a software product that is stored in a storage medium and that includes instructions for causing a computer device (which may be a personal computer, a server, or a network device, etc.) to perform all or part of the steps of the methods of the various embodiments of the present application. The afore mentioned storage medium includes USB flash disk, mobile hard disk drive, read-only memory (ROM), random access memory (RAM), magnetic or optical disk and other various media capable of storing program codes.

The above disclosed are only preferred embodiments of the invention and not intended to limit the scope of the invention. Therefore, equivalent changes made in accordance with the claims of the invention shall remain within the scope of the invention.

What is claimed is:

1. A method for locating a ring power network fault, comprising:

expanding in each ring line segment with an arbitrary point as a coordinate origin in a ring power network to construct a plurality of reference coordinate systems, wherein the each ring line segment is a line segment between two adjacent monitoring point positions;

acquiring monitoring point coordinate information and wavehead arrival time information of each of the monitoring point positions in each of the plurality of reference coordinate systems;

acquiring assumed fault point information, wherein the assumed fault point information comprises an assumed fault point coordinate, assumed occurrence fault time and an assumed fault section;

acquiring a traveling wave propagation speed;

constructing a plurality of distributed fault location equation sets according to the monitoring point coordinate information, the wavehead arrival time information, the assumed fault point information and the traveling wave propagation speed in each of the plurality of reference coordinate systems; and determining an actual fault position according to a solution result of each of the plurality of distributed fault location equation sets and the assumed fault section, wherein the constructing the plurality of distributed fault location equation sets according to the monitoring point coordinate information, the wavehead arrival time information, the assumed fault point information and the traveling wave propagation speed in each of the plurality of reference coordinate systems comprises:

constructing a fault location default equation set if the wavehead arrival time information is missing at some of the monitoring point positions;

constructing the plurality of distributed fault location equation sets according to the fault location default system equation set, and the acquired monitoring point coordinate information, the wavehead arrival time information, the assumed fault section and the traveling wave propagation speed in each of the plurality of reference coordinate systems, wherein the fault location default system equation set is as follows:

$$\begin{cases} |x-x_0| = |t-t_0|v \\ |x-x_1| = |t-t_1|v \\ |x-x_2| = |t-t_2|v \\ \cdot \\ \cdot \\ |x-x_{i-n}| = |t-t_{i-n}|v \end{cases}$$

wherein x is the assumed fault point coordinate, t is the assumed fault occurrence time, $x_0$, $X_1$, . . . , $X_{i-n}$ is the monitoring point coordinate information, $t_0$, $t_1$, . . . , $t_{i-n}$ is the wavehead arrival time information, n is a number of the monitoring point positions without acquiring the wavehead arrival time information, and v is the traveling wave propagation speed.

2. The method according to claim 1, wherein the assumed fault section comprises a first assumed fault section, each of the reference coordinate system comprises a first reference coordinate system, the plurality of distributed fault location equation sets comprise a first distributed fault location equation set, wherein the first distributed fault location equation set is determined according to the first assumed fault section, the traveling wave propagation speed, and the monitoring point coordinate information and the wavehead arrival time information in the first reference coordinate system, wherein the determining the actual fault position according to the solution result of each of the plurality of distributed fault location equation sets and the assumed fault section comprises:

solving the first distributed fault location equation set to determine a first assumed fault position; and taking the first assumed fault position as the actual fault position if the first assumed fault position is located in the first assumed fault section.

3. The method according to claim 2, wherein the assumed fault section further comprises a second assumed fault section, the reference coordinate system further comprises a second reference coordinate system, the plurality of distributed fault location equation sets further comprise a second distributed fault location equation set and a third distributed fault location equation set, wherein the second distributed fault location equation is determined according to the second assumed fault section, the traveling wave propagation speed, and the monitoring point coordinate information and the wavehead arrival time information in the first reference coordinate system, wherein the third distributed fault location equation set is determined according to the first assumed fault section, the traveling wave propagation speed, and the monitoring point coordinate information and the wavehead arrival time information in the second reference coordinate system, wherein the method further comprises:

solving a second distributed fault location equation set to determine a second assumed fault position if the first assumed fault position is outside the first assumed fault section;

taking the second assumed fault position as the actual fault position if the second assumed fault position is in the second assumed fault section;

or solving a third distributed fault location equation set to determine a third assumed fault position if the first assumed fault position is outside the first assumed fault section; and taking the third assumed fault position as the actual fault position if the third assumed fault position is located in the first assumed fault section.

4. The method according to claim 1, wherein any of the monitoring point positions is arranged at one or more of a connection of a bus bar and a line, a connection of a cable and an overhead line of different line types, a connection of two lines with different line diameters, and a section with a line length being greater than a preset length and with a needed accurate location, wherein any of the monitoring point positions is arranged with a traveling wavehead monitoring sensor, the traveling wavehead monitoring sensor is configured to determine a wavehead arrival time of a corresponding monitoring point, and the traveling wavehead monitoring sensor comprises a current type and a voltage type.

5. The method according to claim 1, wherein the determining the actual fault position according to the solution result of each of the plurality of distributed fault location equation sets and the assumed fault section comprises:

determining the actual fault position by using a mathematical statistical method according to the solution result if the solution result of one of the plurality of distributed fault location equation sets falls into an assumed fault section, wherein the mathematical statistical method comprises at least one of an average method, a least squares method, a variance method and a mathematical expectation method.

6. A ring power network fault location apparatus, configured to execute the method for locating the ring power network fault according to claim 1, wherein the ring power network fault location apparatus comprises:

a memory, configured to store a computer program; and a processor, configured to run the computer program to:

expand in each ring line segment with an arbitrary point as a coordinate origin in a ring power network to construct a plurality of reference coordinate systems, wherein the each ring line segment is a line segment between two adjacent monitoring point positions;

acquire monitoring point coordinate information and wavehead arrival time information of each of the monitoring point positions in each of the plurality of reference coordinate systems;

acquire assumed fault point information, wherein the assumed fault point information comprises an assumed fault point coordinate, assumed occurrence fault time and an assumed fault section;

acquire a traveling wave propagation speed;

construct a plurality of distributed fault location equation sets according to the monitoring point coordinate information, the wavehead arrival time information, the assumed fault point information and the traveling wave propagation speed in each of the plurality of reference coordinate systems; and determine an actual fault position according to a solution result of each of the plurality of distributed fault location equation sets and the assumed fault section.

7. An electronic device comprising a memory, a processor and a computer program stored in the memory and running on the processor, wherein the processor, when executing the computer program stored in the memory, implements the following steps:

expanding in each ring line segment with an arbitrary point as a coordinate origin in a ring power network to construct a plurality of reference coordinate systems, wherein the each ring line segment is a line segment between two adjacent monitoring point positions;

acquiring monitoring point coordinate information and wavehead arrival time information of each of the monitoring point positions in each of the plurality of reference coordinate systems;

acquiring assumed fault point information, wherein the assumed fault point information comprises an assumed fault point coordinate, assumed occurrence fault time and an assumed fault section;

acquiring a traveling wave propagation speed;

constructing a plurality of distributed fault location equation sets according to the monitoring point coordinate information, the wavehead arrival time information, the assumed fault point information and the traveling wave propagation speed in each of the plurality of reference coordinate systems; and determining an actual fault position according to a solution result of each of the plurality of distributed fault location equation sets and the assumed fault section, wherein the constructing the plurality of distributed fault location equation sets according to the monitoring point coordinate information, the wavehead arrival time information, the assumed fault point information and the traveling wave propagation speed in each of the plurality of reference coordinate systems comprises:

constructing a fault location default equation set if the wavehead arrival time information is missing at some of the monitoring point positions;

constructing the plurality of distributed fault location equation sets according to the fault location default system equation set, and the acquired monitoring point coordinate information, the wavehead arrival time information, the assumed fault section and the traveling wave propagation speed in each of the plurality of reference coordinate systems, wherein the fault location default system equation set is as follows:

$$\begin{cases} |x-x_0| = |t-t_0|v \\ |x-x_1| = |t-t_1|v \\ |x-x_2| = |t-t_2|v \\ \vdots \\ |x-x_{i-n}| = |t-t_{i-n}|v \end{cases}$$

wherein x is the assumed fault point coordinate, t is the assumed fault occurrence time, $x_0, X_1, \ldots, X_{i-n}$ is the monitoring point coordinate information, $t_0, t_1, \ldots, t_{i-n}$ is the wavehead arrival time information, n is a number of the monitoring point positions without acquiring the wavehead arrival time information, and v is the traveling wave propagation speed.

8. The electronic device according to claim 7, wherein the assumed fault section comprises a first assumed fault section, each of the reference coordinate system comprises a first reference coordinate system, the plurality of distributed fault location equation sets comprise a first distributed fault location equation set, wherein the first distributed fault location equation set is determined according to the first assumed fault section, the traveling wave propagation speed, and the monitoring point coordinate information and the wavehead arrival time information in the first reference coordinate system, wherein the determining the actual fault position according to the solution result of each of the plurality of distributed fault location equation sets and the assumed fault section comprises:

solving the first distributed fault location equation set to determine a first assumed fault position; and taking the first assumed fault position as the actual fault position if the first assumed fault position is located in the first assumed fault section.

9. The electronic device according to claim 8, wherein the assumed fault section further comprises a second assumed fault section, the reference coordinate system further comprises a second reference coordinate system, the plurality of distributed fault location equation sets further comprise a second distributed fault location equation set and a third distributed fault location equation set, wherein the second distributed fault location equation is determined according to the second assumed fault section, the traveling wave propagation speed, and the monitoring point coordinate information and the wavehead arrival time information in the first reference coordinate system, wherein the third distributed fault location equation set is determined according to the first assumed fault section, the traveling wave propagation speed, and the monitoring point coordinate information and the wavehead arrival time information in the second reference coordinate system, wherein the method further comprises:

solving a second distributed fault location equation set to determine a second assumed fault position if the first assumed fault position is outside the first assumed fault section;

taking the second assumed fault position as the actual fault position if the second assumed fault position is in the second assumed fault section;

or solving a third distributed fault location equation set to determine a third assumed fault position if the first assumed fault position is outside the first assumed fault section; and taking the third assumed fault position as the actual fault position if the third assumed fault position is located in the first assumed fault section.

10. The electronic device according to claim 7, wherein any of the monitoring point positions is arranged at one or more of a connection of a bus bar and a line, a connection of a cable and an overhead line of different line types, a connection of two lines with different line diameters, and a section with a line length being greater than a preset length and with a needed accurate location, wherein any of the monitoring point positions is arranged with a traveling wavehead monitoring sensor, the traveling wavehead monitoring sensor is configured to determine a wavehead arrival time of a corresponding monitoring point, and the traveling wavehead monitoring sensor comprises a current type and a voltage type.

11. The electronic device according to claim 7, wherein the determining the actual fault position according to the solution result of each of the plurality of distributed fault location equation sets and the assumed fault section comprises:

determining the actual fault position by using a mathematical statistical method according to the solution result if the solution result of one of the plurality of distributed fault location equation sets all falls into an assumed fault section, wherein the mathematical statistical method comprises at least one of an average method, a least squares method, a variance method and a mathematical expectation method.

* * * * *